US009478913B2

(12) United States Patent
Bräunlich et al.

(10) Patent No.: US 9,478,913 B2
(45) Date of Patent: Oct. 25, 2016

(54) ELECTRONICS MODULE FOR INSERTION INTO A CARRIER UNIT

(71) Applicants: Michael Bräunlich, Chemnitz (DE); Thomas Ott, Erlau OT Milkau (DE)

(72) Inventors: Michael Bräunlich, Chemnitz (DE); Thomas Ott, Erlau OT Milkau (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 13/927,699

(22) Filed: Jun. 26, 2013

(65) Prior Publication Data

US 2014/0011386 A1   Jan. 9, 2014

(30) Foreign Application Priority Data

Jul. 6, 2012   (EP) ..................... 12175259

(51) Int. Cl.
| | |
|---|---|
| *H01R 13/641* | (2006.01) |
| *H01R 13/64* | (2006.01) |
| *H01R 13/645* | (2006.01) |
| *H01R 13/703* | (2006.01) |
| *H05K 7/14* | (2006.01) |

(52) U.S. Cl.
CPC ...... *H01R 13/6456* (2013.01); *H01R 13/7039* (2013.01); *H05K 7/1455* (2013.01); *H05K 7/1468* (2013.01); *H05K 7/1474* (2013.01)

(58) Field of Classification Search
USPC ........... 439/53, 63, 156, 350, 252, 304, 312, 439/367, 380, 493, 613, 620.03, 146, 147, 439/148, 76.1, 620.22, 620.24, 620.25, 677, 439/680, 681, 633, 955, 489
See application file for complete search history.

(56) References Cited

U.S. PATENT DOCUMENTS

| | | | |
|---|---|---|---|
| 4,738,632 A | 4/1988 | Schmidt et al. | |
| 5,357,243 A | 10/1994 | Tice | |
| 6,059,600 A * | 5/2000 | Vanbesien | 439/378 |
| 6,302,745 B1 * | 10/2001 | Landis et al. | 439/681 |
| 6,383,031 B1 | 5/2002 | Law et al. | |
| 6,402,565 B1 * | 6/2002 | Pooley et al. | 439/680 |
| 6,411,500 B1 | 6/2002 | Kaaden et al. | |
| 6,476,520 B1 * | 11/2002 | Bohm et al. | 307/104 |
| 6,632,107 B1 * | 10/2003 | Vanbesien | 439/680 |
| 2009/0220013 A1 * | 9/2009 | Butts et al. | 375/257 |

(Continued)

FOREIGN PATENT DOCUMENTS

| | | |
|---|---|---|
| CN | 1320986 | 11/2001 |
| DE | 195 14 842 | 10/1996 |
| DE | 197 48 429 | 5/1999 |
| DE | 10 2007 025458 | 12/2008 |

(Continued)

*Primary Examiner* — Amy Cohen Johnson
*Assistant Examiner* — Matthew T Dzierzynski
(74) *Attorney, Agent, or Firm* — Cozen O'Connor

(57) ABSTRACT

An electronics module configured for insertion into a carrier unit and having, arranged on a rear side, a coding pair including a first coding part and a second coding part, wherein the first and second coding parts are configured in accordance with the lock-and-key principle, the first coding part being snapped into place in the rear side, while the second coding part is removably arranged on the first coding part, wherein a plug-and-socket connector is arranged on the second coding part such that a mating plug-and-socket connector arranged in the interior of the electronics module is insertable into the plug and-socket connector to establish an electrical connection, and wherein a memory chip which is connected to the plug and socket connector is also arranged on the second coding part.

9 Claims, 4 Drawing Sheets

(56) References Cited

U.S. PATENT DOCUMENTS

2012/0094509 A1* 4/2012 Bryan et al. .......... 439/76.1
2013/0280950 A1* 10/2013 Becavin .............. 439/488
2014/0199889 A1* 7/2014 Huang .............. 439/620.22

FOREIGN PATENT DOCUMENTS

| EP | 0 236 711 | 9/1987 |
| EP | 0 592 923 | 4/1994 |
| WO | WO 2008/151909 | 12/2008 |

* cited by examiner

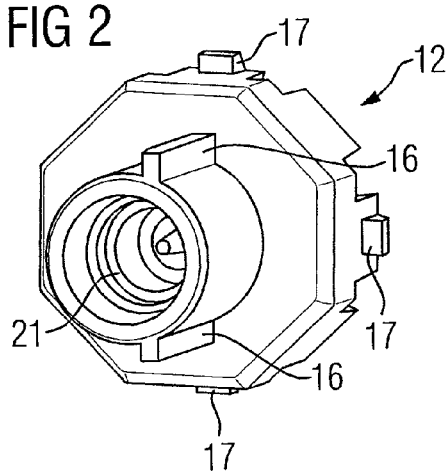
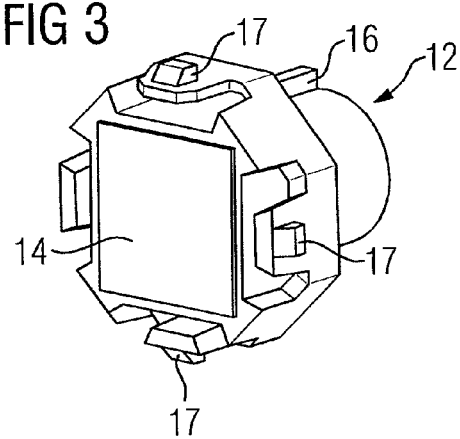
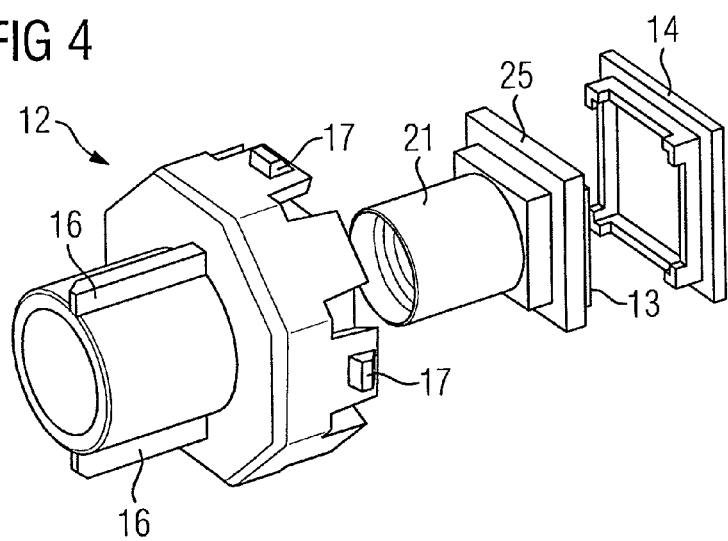
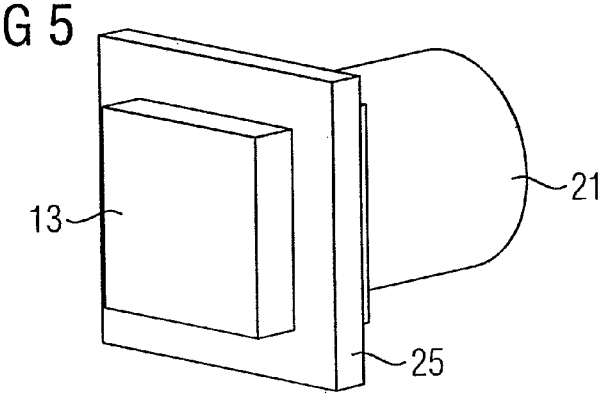

ELECTRONICS MODULE FOR INSERTION INTO A CARRIER UNIT

BACKGROUND OF THE INVENTION

1. Field of the Invention

The invention relates to an electronics module configured for insertion into a carrier unit and having arranged on a rear face a coding pair comprising a first coding part and a second coding part, where the first and the second coding part are configured according to the lock-and-key principle, and the first coding part being arranged snapped into place in the rear side, while the second coding part is removably arranged around the first coding part.

2. Description of the Related Art

Particularly in the case of automation devices, electronic control devices for automation engineering applications are often constructed in two parts. Preferably, the first part comprises an electronics module having electronic components that are required for solving control tasks. The second part is referred to as a carrier unit and serves among other things for realizing a modular configuration consisting of a plurality of electronics modules to form an automation component. In addition, the carrier unit has connecting terminals for signal lines coming from a process that is to be automated. By virtue of this two-part design, it is possible to replace a defective electronics module quickly, particularly in the event of a fault, because there is no need to disengage the wiring of the signal lines and reconnect the signal lines subsequently. Furthermore, the two-part construction affords advantages during the building of a plant that is to be automated, because the carrier unit can be installed and wired first and the corresponding electronics modules can be inserted later.

A process connector for connecting process lines to an input/output module of the control system is known from DE 195 14 824 A1. Here, the process connector or, as the case may be, the input/output module has a coding element and a mating coding element. In existing systems of this type, it has proven beneficial to dispose an autonomously acting mechanical coding arrangement between the electronics module and the carrier unit. For that purpose, a two-part coding arrangement is mounted in a captive manner in the housing of the electronics module. In that arrangement, the first part snaps into place in the housing such that only destructive removal and/or removal via a tool is possible. The second part of the coding arrangement is joined to the first via a snap-fit connection, preferably in a form- and force-fit manner, such that it cannot become detached of its own accord during "normal" handling of the electronics module. When the electronics module is plugged into the carrier unit, the second part of the coding arrangement snaps into place in the carrier unit and remains in the carrier unit when the electronics module is again withdrawn from the carrier unit. This ensures that when a defective electronics module is replaced at this position in the carrier unit, only an electronics module having identical coding can be reinserted.

However, when it comes to building automation components that must necessarily guarantee failsafe operation, such as petrochemical industry, the principle of the mechanical coding arrangement is no longer fit for its purpose.

SUMMARY OF THE INVENTION

It therefore an object of the present invention to develop the coding principle further such that it can also be utilized for failsafe automation systems.

This and other objects and advantages are achieved in accordance with the invention by providing an electronics module configured for insertion into a carrier unit and having, arranged on a rear side, a coding pair comprising a first coding part and a second coding part, where the first and the second coding part are configured according to the lock-and-key principle, the first coding part being arranged snapped into place in the rear side, while the second coding part is removably arranged on the first coding part, the object is achieved in that a plug-and-socket connector is arranged on the second coding part such that a mating plug-and-socket connector arranged in the interior of the electronics module can be inserted into the plug-and-socket connector to establish an electrical connection, where a memory chip that is connected to the plug-and-socket connector is additionally arranged on the second coding part. Because the second coding part now includes a memory chip, information can be stored in the memory chip, which information can be evaluated accordingly when an electronics module is replaced, thereby enabling failsafe systems to be built.

In order to provide a plurality of coding possibilities for different types of electronics modules, the first coding part is configured such that it can snap into place in different positions in the rear side and as a result multiple coding options will be created. With this approach, the coding parts are preferably able to rotate, being configured, for example, in an octagonal shape, and consequently are able to be snapped into place in a plurality of different positions in the electronics module, thus producing multiple coding possibilities. Mutual engagement of the two coding parts is achieved via a suitable shaping of the key and the "keyhole". Similar parts having different contours in the area of the key/keyhole enable new coding pairs to be realized and multiply the possibility of mutually exclusive coding arrangements.

An advantageous embodiment of the electronics module with a view to its applicability in a subsequent construction of modular automation components composed of different electronics modules is produced if the coding pair is configured such that when the electronics module is inserted into the carrier unit for the first time, the second coding part snaps into place in the carrier unit and remains captive there. After the implementation of a carrier unit in a process that is to be automated and following the configuration of the electronics modules, at which time it is established which electronics module will assume which task, it is of advantage if, after the electronics module charged with a specific task is inserted for the first time, the second coding part associated with the electronics module snaps into place in the carrier unit, and as a result remains in the carrier unit, and installing a new electronics module as replacement will be possible only if it has a corresponding coding.

In an advantageous embodiment, in particular with regard to a safety application in a failsafe automation system, the memory chip is configured to accommodate unique address data for a failsafe automation system. Should the situation arise that the mechanical coding arrangement is not sufficient and a different module having a mistakenly inserted identical coding mechanism is inadvertently plugged into a mounting location of the carrier unit, unique address data of the electronics module will be retrieved from the memory chip. By means of the unique address data, it can be verified whether the electronics module may in fact be inserted at this plug-in slot, taking into account the failsafe configurations of the automation devices.

It is furthermore advantageous if the memory chip is configured for saving data in the event of a failure of the electronics module.

It is furthermore advantageous, in order to ensure the ability of the coding parts to rotate, if the plug-and-socket connector is configured as a coaxial connector.

In order to ensure that, for example, the second coding part will not be lost when the electronics module is first removed from the packaging, the coaxial connector is configured such that the retaining force between plug-and-socket connector and mating plug-and-socket connector is sufficiently great to prevent the second coding part from being released from the electronics module until the electronics module, after having been inserted into the carrier unit, is withdrawn from the carrier unit once more.

In particular, when electronics modules are deployed in failsafe automation components, the electronics module is advantageously provided with a means for evaluating the data on the memory chip.

In a further embodiment, the electronics module has an inhibiting device which is connected to the data evaluation device and is configured to compare set point values with actual values and to activate or deactivate the electronics module as a function of a comparison result. With the comparative consideration to determine whether the electronics module is inserted in the right slot, the level of safety with regard to failsafe automation systems is increased further.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

An exemplary embodiment is illustrated in the drawing, in which:

FIG. 2 shows a second coding part of a pair consisting of a first and a second coding part according to the invention;

FIG. 3 shows the second coding part in a view from the rear according to the invention;

FIG. 4 shows the second coding part in a view revealing its individual elements according to the invention;

FIG. 5 shows a coaxial connector with a printed circuit board mounted thereon and a memory chip according to the invention;

DETAILED DESCRIPTION OF THE PREFERRED EMBODIMENTS

Figure 1:
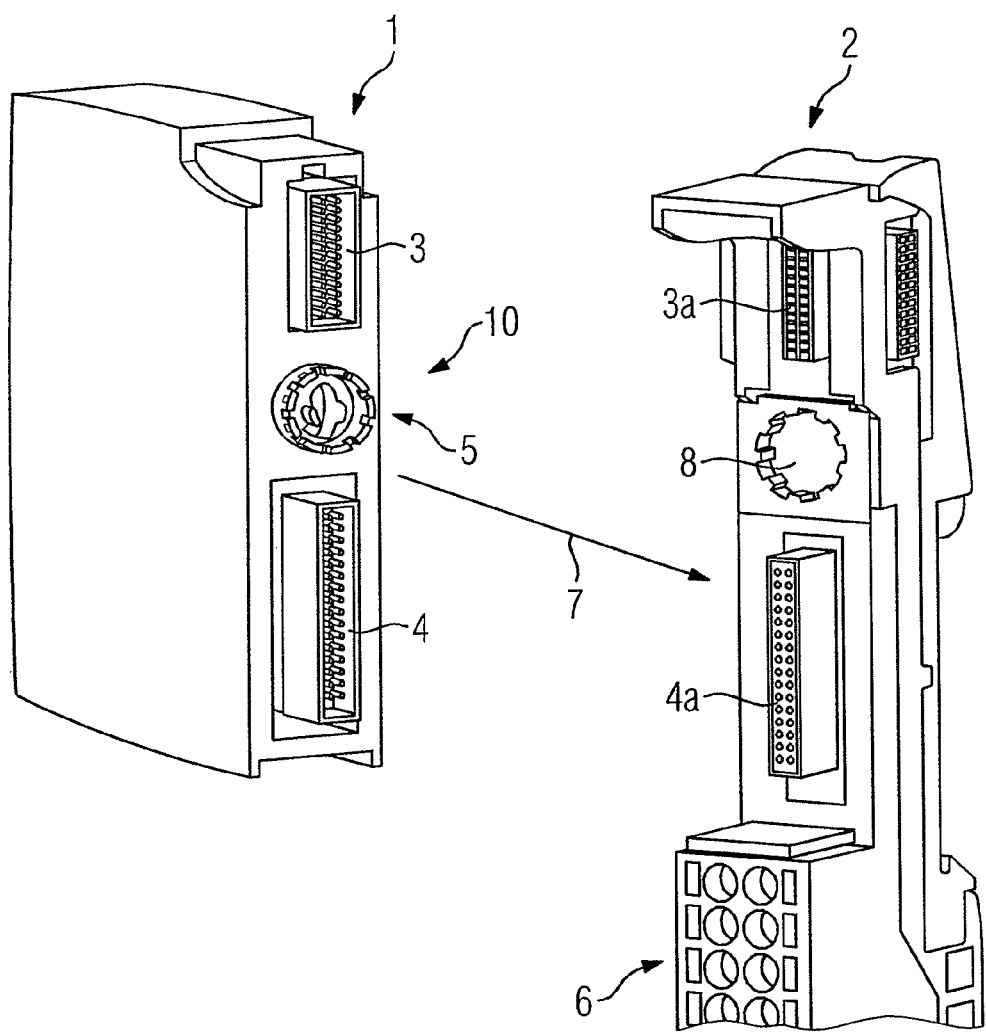
FIG. 1 shows an electronics module 1 and a carrier unit 2 according to the prior art.

The diagram according to FIG. 1 shows the prior art. An electronics module 1 can be inserted in an insertion direction 7 into a carrier unit 2. Arranged on a rear side 10 of the electronics module 1 are a first connector strip 3 and a second connector strip 4 which can be inserted into a first mating connector strip 3a and a second mating connector strip 4a, respectively, of the carrier unit 2. To ensure the electronics module 1 is coded, it additionally has on the rear side 10 a coding pair 5 which finds its matching part in the carrier unit 2 in a receptacle 8 for the second coding part.

The carrier unit 2 additionally has connecting terminals 6 for signal lines from a process that is to be automated. The carrier unit 2 is configured as a base unit which can be built up in a modular manner, with a multiplicity of carrier units 2 being able to be connected to one another in an array. Each carrier unit 2 is fitted at the side with contact points to enable an individual carrier unit 2 to communicate with the next carrier unit 2.

According to FIG. 2, the second coding part 12 from the coding pair 5 consisting of a first coding part 11 and a second coding part 12 (see FIG. 6) is shown in a three-dimensional view. A coaxial connector 21 is arranged centrally inside the second coding part 12. The second coding part 12 is configured in an octagonal shape as a molded plastic part and has latching lugs 17 on four of its eight edges. When the second coding part 12 is inserted into the carrier unit 2, the latching lugs 17 serve for locking the second coding part 12 into the carrier unit 2 and for ensuring the second coding part 12 remains in the carrier unit 2. Coding teeth 16 are arranged on a plastic cylinder to allow coding according to the lock-and-key principle. This embodiment enables the second coding part 12 to be rotated via its first coding part 11 (see FIG. 6) into a plurality of positions and to be snapped into place in the electronics module 1.

FIG. 3 shows the second coding part 12 from FIG. 2 in a rear view. In addition to the features cited with reference to FIG. 2, the second coding part 12 has a protective cover 14 on a rear side. The coaxial connector 21 is arranged under the protective cover 14.

FIG. 4 illustrates the structure of the second coding part 12. Arranged inside the second coding part 12 under the protective cover 14 is the plug-and-socket connector 21, which itself is mounted on a printed circuit board 25. The plug-and-socket connector 21 is electrically connected to a memory chip 13 through the printed circuit board 25.

FIG. 5 shows the plug-and-socket connector 21 arranged on the printed circuit board 25 together with the associated memory chip 13.

Figure 6:
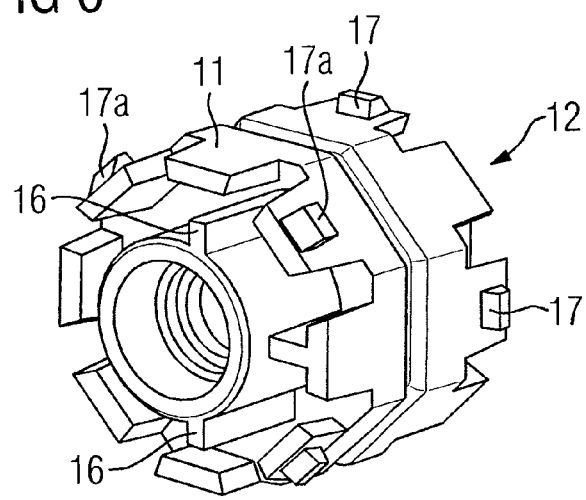
FIG. 6 shows the first coding part and the second coding part joined together according to the invention.

FIG. 6 shows the coding pair 5 consisting of the first coding part 11 and the second coding part 12. The first and second coding parts 11,12 are configured according to the lock-and-key principle, the second coding part 12 being removably arranged on the first coding part 11. With its further latching lugs 17a, the first coding part 11 is configured to snap into place in the rear side 10 of the electronics module 1 (see FIG. 7) and to remain in the electronics module 1.

Figure 7:
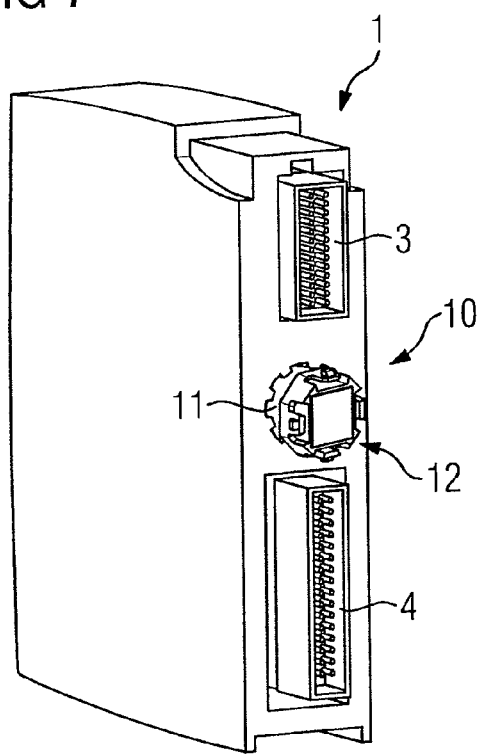
FIG. 7 shows an electronics module with inserted first and second coding parts according to the invention.

FIG. 7 shows an electronics module 1 with a first coding part 11 snapped into place and a second coding part 12 inserted into the first coding part 11 via the coaxial connector 22.

Figure 8:
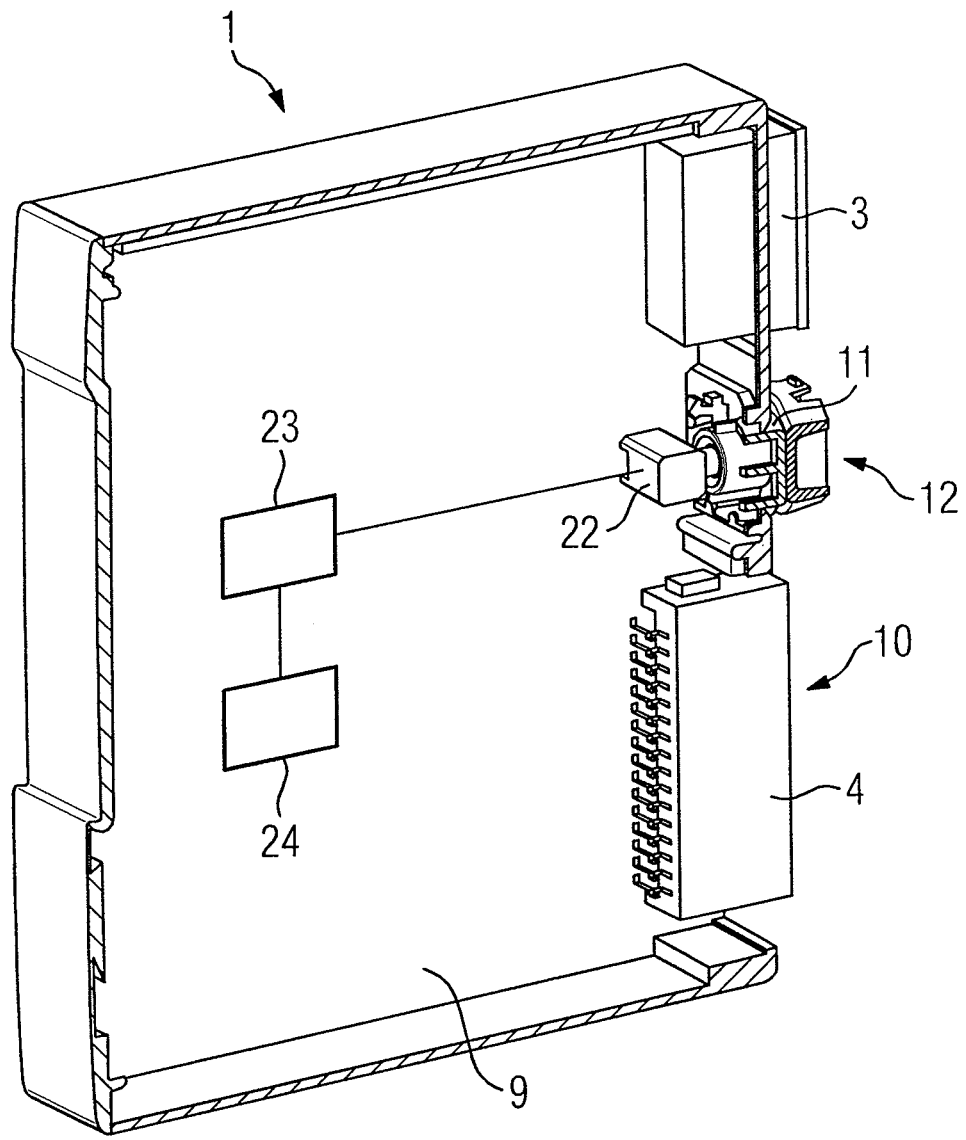
FIG. 8 shows the electronics module of FIG. 7 in a sectional view with an open housing.

FIG. 8 depicts the electronics module 1 from FIG. 7 in a sectional view with open housing. The first coding part 11 and the second coding part 12 are arranged on the rear side 10 between the first connector strip 3 and the second connector strip 4. The first coding part 11 is locked firmly in place in the housing wall of the rear side 10 of the electronics module 1 via its further latching lugs 17a.

A mating plug-and-socket connector 22 is arranged on a flat printed circuit board assembly 9 in the interior of the electronics module 1. The plug-and-socket connector 21 arranged in the interior of the second coding part 12 fits precisely in the mating plug-and-socket connector 22 and via the plug-and-socket connection an electrical connection is established to the memory chip 13 inside the second coding part 12.

Taking an electronics module 1 in an unused socket, the second coding part 12 is secured in the rear side 10 of the electronics module 1 by way of the retaining force of the plug-and-socket connector 21 and the mating plug-and-socket connector 22. In this case, the plug-and-socket connector 21 and the mating plug-and-socket connector 22 are configured as a coaxial connector such that the retaining force between the male coaxial connector part and the female coaxial connector part is sufficiently great to ensure that the second coding part 12 will not detach itself from the electronics module 1 until, after having been inserted into the carrier unit 2, the electronics module 1 is once more withdrawn from the carrier unit 2. The mating plug-and-socket connector 22 is connected by way of a data line to a means 23 for evaluating the data on the memory chip 13. In addition, the printed circuit board 9 has an inhibiting means 24 which is connected to the data evaluation means 23 and is configured to compare set point values and to activate or deactivate the electronics module 1 as a function of a comparison result. The comparative consideration particularly serves to decide whether the inserted electronics module 1 has been inserted into the right slot.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An electronics module configured for insertion into a carrier unit and having, arranged on a rear side, a coding pair, comprising:
    a first coding part;
    an octagonally shaped second coding part including a plurality of latching lugs arranged on outer edges of the octagonally shaped second coding part and coding teeth arranged on a cylinder extending from a rear of the octagonally shaped second coding part, the first coding part and the octagonally shaped second coding part being configured in accordance with a lock-and-key principle, the first coding part being arranged to snap into place in the rear side, and the octagonally shaped second coding part being removably arranged on the first coding part;
    a mating plug-and-socket connector arranged on a printed circuit board assembly within an interior of the electronics module;
    a plug-and-socket connector mounted on a further printed circuit board and arranged within the octagonally shaped second coding part such that the mating plug-and-socket connector is insertable into the plug-and-socket connector to establish an electrical connection; and
    a memory chip configured to hold unique address data for a failsafe automation system, said memory chip being arranged on the further printed circuit board of the plug-and-socket connector and arranged on the octagonally shaped second coding part.

2. The electronics module as claimed in claim 1, wherein the first coding part is configured to snap into place in different positions in the rear side and to provide a plurality of coding possibilities.

3. The electronics module as claimed in claim 1, wherein the coding pair is configured such that when the electronics module is initially inserted into the carrier unit, the octagonally shaped second coding part snaps into place in the carrier unit and remains captive in the carrier unit.

4. The electronics module as claimed in claim 2, wherein the coding pair is configured such that when the electronics module is initially inserted into the carrier unit, the octagonally shaped second coding part snaps into place in the carrier unit and remains captive in the carrier unit.

5. The electronics module as claimed in claim 1, wherein the memory chip is configured to save data in an event of a failure of the electronics module.

6. The electronics module as claimed in claim 1, wherein the plug-and-socket connector comprises a coaxial connector.

7. The electronics module as claimed in claim 6, wherein the coaxial connector is configured such that a retaining force between the plug-and-socket connector and the mating plug-and-socket connector ensures that the octagonally shaped second coding part remains attached to the electronics module until the electronics module, after having been inserted into the carrier unit, is once more withdrawn.

8. The electronics module as claimed in claim 5, further comprising:
    a data evaluator for evaluating the data on the memory chip.

9. The electronics module as claimed in claim 8, further comprising:
    an inhibitor for comparing setpoint values with actual values and for one of activating and deactivating the electronics module as a function of a comparison result, the inhibitor being connected to the data evaluator for evaluating the data on the memory chip.

* * * * *